United States Patent [19]

Szabo

[11] 4,432,071
[45] Feb. 14, 1984

[54] APPARATUS FOR FAST ACCESS TO A SERIES OF STORED IMAGES

[75] Inventor: Alexander Szabo, Gloucester, Canada

[73] Assignee: Canadian Patents & Dev. Limited, Ottawa, Canada

[21] Appl. No.: 327,067

[22] Filed: Dec. 4, 1981

[51] Int. Cl.³ .................... G11C 11/42; G11C 13/04
[52] U.S. Cl. .................... 365/124; 365/120; 365/125
[58] Field of Search ............... 365/120, 121, 124, 125

[56] References Cited

U.S. PATENT DOCUMENTS 3,912,391 10/1975 Fleisher et al. .................. 365/124
3,935,566 1/1976 Snopko .......................... 365/124
4,011,435 3/1977 Phelps .......................... 365/124

Primary Examiner—Terrell W. Fears
Attorney, Agent, or Firm—Edward Rymek

[57] ABSTRACT

The apparatus includes a frequency selective memory having a storage material for storing frequency holes in at least two spatial dimensions and a frequency dimension. Interference patterns are stored in the memory such that each complete interference pattern is found in the spatial dimensions while the series of interference patterns is in the frequency dimension. A laser beam is directed onto the surface of the memory to read the memory. By changing the electric field across the storage material, subsequent interference patterns are shifted in the frequency dimension into resonance with the laser beam thereby changing the interference pattern detected. The interference patterns may be a series of holographic interference patterns which would provide as an output a series of three dimensional images, or they may be a series of gratings which would provide a laser beam which scans in a spatial dimension as an output.

4 Claims, 3 Drawing Figures

APPARATUS FOR FAST ACCESS TO A SERIES OF STORED IMAGES

BACKGROUND OF THE INVENTION

This invention is directed to apparatus having successively accessible images in memory and, in particular, to the spatial scanning of a laser beam by successively accessing gratings with different line spacings.

Apparatus, in which successive images may be accessed simply and rapidly, can have complex applications such as the projection of motion pictures by scanning two or three dimension holographic images, or it can have simple applications such as the spatial scanning of a laser beam.

The spatial scanning of a laser beam finds application in imaging or printing devices, optical memories, such as described in U.S. Pat. No. 3,896,420 which issued July 22, 1975 to A. Szabo, optical radars, and many other optical devices. At present, three main methods exist for spatially scanning laser beams. These are generally categorized as mechanical, acousto-optical or electro-optical scanning. The mechanical scanners which include devices such as rotating mirrors, have the limitation of a low scan speed because of mechanical inertia, as well as poor reliability because of mechanical wear. In acousto-optic scanning, the beam is diffracted off an acoustic grating generated in a media such as glass. The scan time between spots is limited, typically, to the range 1-10 $\mu$sec due to the grating formation time as determined by the speed of sound in the material. Electro-optic scanning is faster than acoustooptic scanning since it is only limited by the speed of light in the material and quite reliabe since it is non-mechanical. However, it is complex and lossy due to the large number of crystals required-one for each resolvable spot.

SUMMARY OF THE INVENTION

It is therefore an object of this invention to provide apparatus in which a series of interference patterns in a memory may be accessed at high speed by an optical beam incident on the memory to produce a series of images.

These and other objects are achieved in an apparatus which includes an optical memory having a storage material for storing frequency holes in at least two spatial dimensions and a frequency dimension. Image information contained in holographic interference patterns is stored in two or three spatial dimensions of the memory as frequency holes. A series of different interference patterns are stored in the frequency dimension. Transparent electrodes are located on two surfaces of the storage material. The electrodes produce an electric field across the storage material to shift the frequency holes in the frequency dimension. A control element directs an optical beam of wavelength $\lambda$ onto one surface of the the memory to readout the memory. A controlled voltage source which is connected to the electrodes provides a varying electric field potential, thereby shifting successive interference patterns into resonance with the optical beam of wavelength, which are read out of the memory.

In accordance with one aspect of this invention, the stored interference patterns may be a series of two or three dimensional gratings having different line spacings which, when successively shifted into resonance with the optical beam, will spatially scan the beam. In accordance with another aspect of this invention the interference patterns may be a series of holographic interference patterns which will project a series of three dimensional images.

Many other objects and aspects of the invention will be clear from the detailed description of the drawings.

DETAILED DESCRIPTION

In a co-pending patent application entitled, "Fast Input/Output Technique Using Stark Shifting for a Frequency Selective Optical Memory" filed on even date herewith by A. Szabo, a frequency selective optical memory is described wherein the frequency dimension of the memory is scanned by applying a time varying electric field across the memory storage material to shift frequency holes into resonance with an optical beam having a fixed frequency. This co-pending application is incorporated herein by reference.

Figure 1:
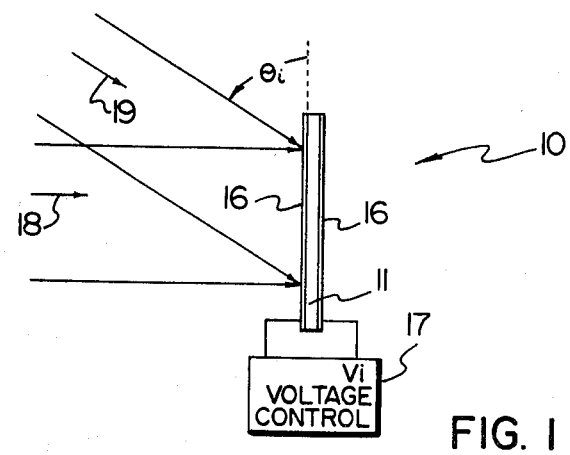
FIG. 1 illustrates the writing of gratings into a memory.

FIG. 1 illustrates such a memory 10. The memory includes a storage material 11 in which information may be stored in both frequency and spatial dimensions. Typical storage materials are listed below in Table 1 and are described in U.S. Pat. No. 3,896,420 which issued July 22, 1975 to A. Szabo; U.S. Pat. No. 4,101,976 which issued on July 18, 1978 to G. Castro et al; U.S. Pat. No. 4,103,346 which issued on July 25, 1978 to D. Haarer et al; and U.S. Pat. No. 4,158,890 which issued on June 19, 1979 to D. M. Burland. A further storage material is described in a publication by J. M. Hayes and G. J. Small, in the Chem. Phys. 27, 151 (1978). In Table 1, the Stark coefficient k and the maximum frequency shift are shown for the storage materials that are listed.

TABLE 1
Stark Coefficient for Various Storage Materials

| Material | Stark Coefficient k | Maximum Frequency Shift |
|---|---|---|
| $Cr:Al_2O_3$ | 0.11 MHz/V cm$^{-1}$ | 20 GHz |
| $Mn:Al_2O_3$ | 0.93 MHz/V cm$^{-1}$ | 200 GHz |
| Pentancene in p-Terphenyl | 0.003 MHz/V cm$^{-1}$ | 0.6 GHz |
| Duryl in durene | 0.13 MHz/V cm$^{-1}$ | 30 GHz |
| Azulene in napthalene | 0.2–0.8 MHz/V cm$^{-1}$ | 40–160 GHz |

Image information in the form of interference patterns are written into the memory 10 in its two or three spatial dimensions by producing a distribution of optical hole depths in the storage material. In accordance with the present invention, various patterns, such as complex holographic interference patterns or simple gratings may be stored in the memory. When a laser beam is incident on the memory, a simple interference pattern such as a grating will cause the beam to deflect in a spatial dimension. However, a complex holographic interference pattern will affect the beam such that a three-dimensional image will be projected.

FIG. 1 illustrates a method for writing gratings into the memory 10 in order to produce an apparatus for spatially scanning an optical beam. This method consists of flooding the storage material 11 surface with two optical beams 18 and 19, both having the same wavelength λ, but projected onto the surface at an angle $\theta_i$ relative to one another. An interference pattern is formed at the surface of the storage material 11, causing a pattern of holes to be burned into the storage material 11. This pattern constitutes a grating having a predetermined spacing between the lines. The stored grating will diffract an incident optical beam of wavelength λ by an angle $\alpha_i$. In order to form interference patterns with different line spacings, the angle $\theta_i$ between the writing beams 18 and 19 is varied. The line spacing $d_i$ is given by the formula:

$$d_i = \lambda/\cos\theta_i$$

The frequency selective optical memory 10 further includes transparent conductive layers 16 placed on the front and back surfaces of the storage material 11. These layers 16 form electrodes by which preselected electric fields may be produced in the storage material 11 when connected to a voltage control circuit 17. The electrodes 16 are required to be both transparent and conductive and thus are made of materials such as indium-tin oxide deposited in any conventional manner, such as by magnetron sputtering. A series of gratings having different line spacings are produced by the same two beams 18 and 19 by varying the angle $74_i$. These gratings are successively stored in the memory 10 in the frequency dimension by frequency shifting each grating after it is written into memory.

To accomplish the frequency shift, a voltage $V_i$ is maintained across the storage material 11 during the writing period and is removed after writing. The optical holes in the frequency dimension shift to new frequencies $f \pm kV_i$ where k is the Stark coefficient and f is the optical beam frequency of wavelength λ. By varying $\theta_i$ and $V_i$, a large number of gratings having different spacing, $d_i$, are written into the storage material. The number of gratings possible is given approximately by the ratio of the maximum Stark shift, $kV_{max}$ which is determined by voltage breakdown, to the homogeneous linewidth. Typical values of the former and the latter are $2 \times 10^{11}$ Hz and $10^7$ Hz, respectively, which allows $\sim 10^4$ gratings to be written.

Figure 2:
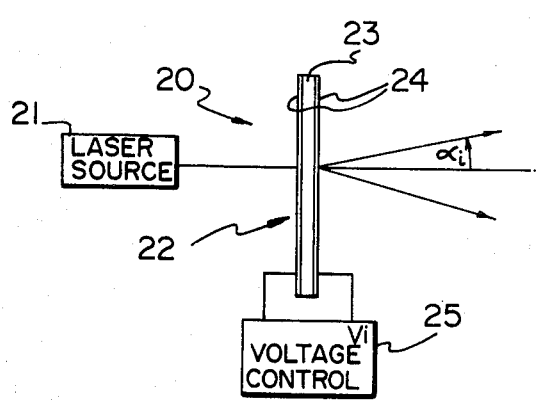
FIG. 2 illustrates a spatial scanner in accordance with the present invention.

FIG. 2 illustrates a laser beam spatial scanner in accordance with the present invention. The scanner 20 includes a laser source 21 for directing a laser beam of wavelength λ onto the surface of a memory 22 in which a series of gratings are stored. Each complete grating is stored in the two spatial dimensions, while the series of gratings is stored in the frequency dimension. The memory 22 includes a storage material 23 as described above and a pair of transparent electrodes 24 covering the surfaces of the storage material 23. A voltage control circuit 25 is connected to the electrode 24. The voltage control circuit 25 is used to apply a sequence of voltages to the electrodes to recall a desired sequence of gratings from the memory.

The gratings may be stored in the memory 22 as a scan sequence and may thus be recalled by applying an increasing or decreasing sequence of voltage levels to the electrodes 24 such that the laser 21 beam is spatially scanned. On the other hand, if it is desired to diffract the beam from laser 21 in a particular pattern, either the sequence of gratings stored in the frequency dimension may be altered or the sequence of voltage levels applied to the electrodes may be altered, providing for a very versatile device.

Figure 3:
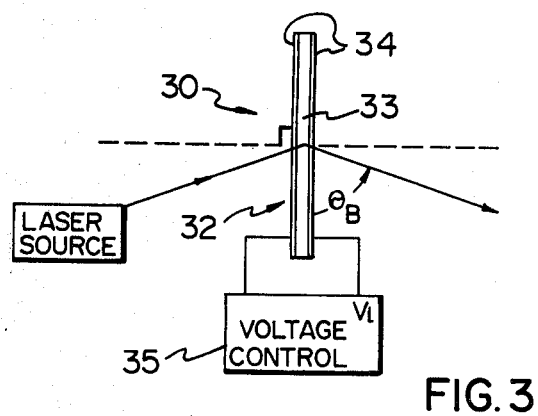
FIG. 3 illustrates an alternative spatial scanner.

In the laser beam scanning device 30, illustrated in FIG. 3, the memory 32 contains a series of 3-dimensional interference patterns written into the storage material 33. The interference patterns, which are perpendicular to the front and back surfaces of the memory 32, are spaced at different distances $d_i$ such that when an optical beam of wavelength λ is projected onto the memory 32 from a source 31, it is diffracted at the bragg angle $\theta_B$ where $2d_i = \cos\theta_B \lambda$. A sequence of interference patterns with different distances $d_i$ are brought into resonance with the input beam of wavelength λ by varying the electric field produced in the storage material 33 by the voltage control circuit 35 connected to the transparent electrodes 34. This method of spatially scanning an optical beam is similar to conventional acoustooptic scanning with the exceptions that it is faster and does not Doppler shift the frequency of the input beam.

It is to be noted that the scanners, described above, spatially scan an optical beam having a fixed wavelength λ using the frequency dimension of an optical memory and, at the same time, without Doppler shifting the optical beam which allows the scanner to be utilized to write or read other optical memories.

Many modifications in the above described embodiments of the invention can be carried out without departing from the scope thereof and, therefore, the scope of the present invention is intended to be limited only by the appended claims.

I claim:

1. Apparatus for providing successively accessible interference patterns comprising:

optical memory means having a storage material for storing frequency holes in at least two spatial dimensions and a frequency dimension, the frequency holes forming interference patterns in at least two spatial dimensions wherein the frequency dimension includes a series of different interference patterns, the optical memory means further having transparent electrode means on two surfaces of the storage material for applying an electric field across the storage material;

means for directing an optical beam of wavelength λ onto the storage means; and control means for varying the electric field potential across the storage material thereby shifting different interference patterns into resonance with the optical beam to provide an optical output of the stored interference patterns.

2. Apparatus as claimed in claim 1 wherein the stored interference patterns consist of a series of two dimensional gratings having different line spacings for spatially scanning the optical beam.

3. Apparatus as claimed in claim 1 wherein the stored interference patterns consist of a series of three dimensional gratings having different line spacings for spatially scanning the optical beam.

4. Apparatus as claimed in claim 1 wherein the stored interference patterns consist of a series of holographic interference patterns for projecting a three dimension image.

* * * * *